United States Patent [19]

Jinda

[11] Patent Number: 5,703,744
[45] Date of Patent: Dec. 30, 1997

[54] CIRCUIT SUBSTRATE INCLUDING ANODIZATION CONTROL MEANS

[75] Inventor: Akihito Jinda, Nara-ken, Japan

[73] Assignee: Sharp Kabushiki Kaisha, Osaka, Japan

[21] Appl. No.: 651,514

[22] Filed: May 22, 1996

[30] Foreign Application Priority Data

May 25, 1995 [JP] Japan .................. 7-126913

[51] Int. Cl.$^6$ .............. H01L 27/01; H01L 29/76; H01L 29/04
[52] U.S. Cl. .............. 361/59; 257/350; 257/351; 257/390; 257/410; 257/469; 257/900; 257/59; 257/72; 437/71; 437/913
[58] Field of Search .............. 361/59; 257/410, 257/350, 900, 57, 59, 72, 351, 390; 437/71, 913

[56] References Cited

U.S. PATENT DOCUMENTS 4,839,002  6/1989  Pernick et al. ............... 204/58
5,485,019  1/1996  Yamazaki et al. ............ 257/57

FOREIGN PATENT DOCUMENTS 6-27493  2/1994  Japan.
6-29279  2/1994  Japan.

*Primary Examiner*—Tom Thomas
*Assistant Examiner*—Fetsum Abraham
*Attorney, Agent, or Firm*—Nixon & Vanderhye, P.C.

[57] ABSTRACT

A circuit substrate includes a plurality of semiconductor devices including electrodes, a wiring having a plurality of branched portions and mainly formed of a metal material, a terminal for applying a voltage to the wiring to anodize the branched portions, and an anodization controller for controlling degrees of anodization of the branched portions. The branched portions serve as the electrodes of the semiconductor devices. The terminal is connected to the wiring.

16 Claims, 8 Drawing Sheets

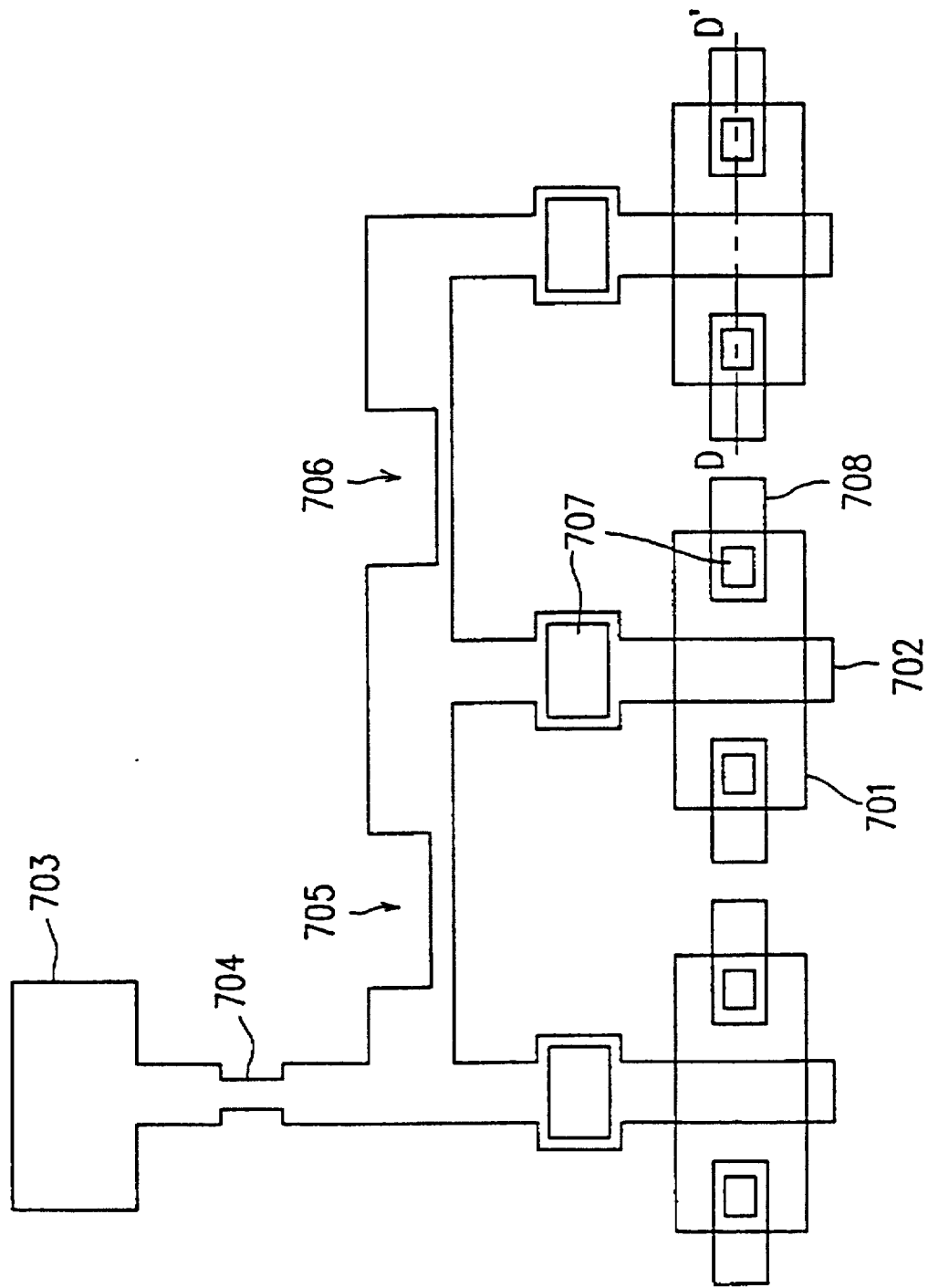

CIRCUIT SUBSTRATE INCLUDING ANODIZATION CONTROL MEANS

BACKGROUND OF THE INVENTION

1. Field of the Invention

The present invention relates to a circuit substrate provided with a transistor for use in an active matrix liquid crystal display apparatus or other electronic circuits.

2. Description of the Related Art

A transistor device formed on a circuit substrate, such as an active matrix substrate or the like, includes a gate electrode, a source electrode and a drain electrode. In a semiconductor fabrication process, a silicon material excellent in heat resistance and a metal material having a high melting point are conventionally used for forming the gate electrode, because these materials are resistant against high temperature.

However, such an electrode material raises the resistance of wirings when used in forming the wirings for a liquid crystal display apparatus or the like. Consequently, materials having low resistance have been examined for their applicability. Recently, a technology for forming a transistor device or the like using a low temperature technique has been developed, leading to the use of a low resistance metal material such as aluminum for forming the gate electrode.

In the case where a low-resistance metal material, such as aluminum, is employed for forming electrodes, the advantageous feature that electric insulation is ensured when an anodization film is formed on the surface of the electrodes is realized. This is because the anodization film provides corrosion-resistance for the electrodes and prevents the deterioration of the electrodes due to hillocks occurring in the electrodes.

In addition, when such a low-resistance metal is used for forming the gate electrode of a transistor for controlling a pixel to be in an ON state or OFF state in a liquid crystal display apparatus and a gate insulation film is formed by anodizing the surface of the gate electrode, offset regions can be formed in a source region and a drain region of a semiconductor layer of the transistor, using the anodization film. More specifically, the source and drain regions are formed in the semiconductor layer by implanting ions into the semiconductor layer to sandwich a channel region located below the gate electrode. Due to the existence of the anodization film formed on the gate electrode, spaces having a width in a channel length direction of the transistor which is equal to the thickness of the anodization film are formed between the edges of the gate electrode and the edges of the source region and the drain region. This space is the offset region. With such a structure, an amount of current leaked between the gate electrode, the source region and the drain region in the transistor can be reduced. Also, the withstand voltage of the drain is improved. As a result, a reliable liquid crystal display apparatus can be obtained.

As described above, in the case of forming the anodization film on the surface of the electrode by an anodization method, various advantages can be provided. However, some problems arise in the anodization process. For example, anodization of metal electrodes is conducted by making current flow through the metal electrodes while a substrate provided with the metal electrodes thereon is immersed in a solution. Therefore, in order to obtain the anodization film having the desired characteristics, it is necessary to carefully control the voltage, current and the period of time during the current flow. In addition, the thickness of the anodization film is different in every production, due to deterioration of the solution or the like.

Furthermore, there is another problem in the case of a driving circuit-integrated liquid crystal display apparatus where a pixel transistor and a driving transistor for driving the pixel transistor are both formed on the same substrate. The driving transistor requires a large ON current in order to increase an operation frequency. On the other hand, the pixel transistor requires a small OFF current in order to prevent image signals from leaking. To achieve this, it is preferable that the offset width in the channel length direction of the driving transistor be short, whereas that of the pixel transistor be long. Accordingly, several types of offset regions having different widths in the channel length direction are required in one substrate depending on the purpose of use of the transistors, and therefore several types of anodization films having different thicknesses are required. However, in order to form the anodization films having different thicknesses, it is necessary to vary the voltage and current during anodization depending on the desired thickness by using several voltage terminals. Alternatively, a period of time may be changed to vary the thicknesses of the anodization films. However, this complicates the production process of the liquid crystal display apparatus having a substrate on which a pixel transistor and a driving circuit including driving transistors are formed.

SUMMARY OF THE INVENTION

A circuit substrate of the present invention includes a wiring mainly formed of a metal material, the wiring having an and portion used as a electrode; a terminal for applying a voltage to the wiring to anodize the wiring, the terminal being connected to another end portion of the wiring; and an anodization control means for controlling the degree of anodization of the wiring, the anodization control means being a portion of the wiring which is closer to the another end portion connected to the terminal than to end portion serving as the electrode. The anodization control means is anodized by the voltage applied by the terminal to form an insulator.

In one embodiment of the invention, the anodization controlling means has a width in accordance with a thickness of an anodization film formed on the surface of the end portion of the wiring.

In another embodiment of the invention, the anodization controlling means has a thickness in accordance with a thickness of an anodization film formed on the surface of the end portion of the wiring.

According to another aspect of the invention, a circuit substrate includes: a plurality of semiconductor devices including electrodes; a wiring having a plurality of branched portions and mainly formed of a metal material, the branched portions serving as the electrodes of the semiconductor devices; a terminal for applying a voltage to the wiring to anodize the branched portions, the terminal being connected to the wiring; and anodization controlling means for controlling degrees of anodization of the branched portions.

In one embodiment of the invention, the anodization controlling means is a portion of the wiring other than the branched portions.

In another embodiment of the invention, the portion has a narrower width than that of the branched portions.

In still another embodiment of the invention, the width of the anodization controlling means is determined in accordance with the degrees of the anodization of the branched portions.

In yet another embodiment of the invention, the portion is thinner than the branched portions.

In another embodiment of the invention, a thickness of the anodization controlling means is determined in accordance with the degrees of the anodization of the branched portions.

In still another embodiment of the invention, the anodization controlling means are portions of the branched portions and are connected in parallel with each other, each of The anodization controlling means having a narrower width than that of a corresponding one of the branched portions.

In yet another embodiment of the invention, the anodization controlling means have different widths.

In another embodiment of the invention, the widths of the anodization controlling means are determined in accordance with the degrees of the anodization of the branched portions.

In still another embodiment of the invention, the anodization controlling means are portions of the branched portions and are connected in series, each of the anodization controlling means having a narrower width than that of a corresponding one of the branched portions.

In yet another embodiment of the invention, the anodization controlling means have different widths.

In another embodiment of the invention, the widths of the anodization controlling means are determined in accordance with the degrees of the anodization of the branched portions.

In still another embodiment of the invention, the anodization controlling means are portions of the branched portions and are connected in parallel with each other, each of the anodization controlling means having a thickness smaller than that of a corresponding one of the branched portions.

In yet another embodiment of the invention, the anodization controlling means have different thicknesses.

In another embodiment of The invention, the thicknesses of the anodization controlling means are determined in accordance with the degrees of the anodization of the branched portions.

In still another embodiment of the invention, the anodization controlling means are portions of the branched portions and are connected in series, each of the anodization controlling means having a thickness smaller than that of a corresponding one of the branched portions.

In yet another embodiment of the invention, the anodization controlling means have different thicknesses, In still another embodiment of the invention, the thicknesses of the anodization controlling means are determined in accordance with the degrees of the anodization of the branched portions.

According to another aspect of the invention, a method for fabricating a circuit substrate including: a plurality of semiconductor devices including electrodes and; a wiring having a plurality of branched portions and mainly formed of a metal material, the branched portions serving as the electrodes of the semiconductor devices includes the steps of: forming a semiconductor layer on a substrate; forming a layer mainly made of the metal material on the semiconductor layer and patterning the layer to form the wiring, a terminal for applying a voltage to the wiring connected to the wiring; anodizing the wiring by applying the voltage to the wiring to form anodization films on the branched portions; and forming source and drain regions by implanting ions to the semiconductor layer. The step of forming the layer mainly made of the metal material form anodization controlling means for controlling degrees of anodization of the branched portions simultaneously with the wiring.

In one embodiment of the invention, the anodization controlling means is formed to have a width narrower than those of the branched portions.

In another embodiment of the invention, the anodization controlling means is formed to have a thickness smaller than those of the branched portions.

According to the present invention, an anodization controller is formed between a voltage application terminal for anodization and a gate electrode. When metal lines are oxidized by anodization end an entire portion of the anodization controller is oxidized to form an oxidized film, the oxidized film stops current from flowing. As a result, a process of anodization is stopped in the gate electrode portion. Such an anodization controller enables current to stop flowing when an anodization film having a desired thickness is formed on the surface of the gate electrode. Thus, it is not necessary to conduct a delicate control of the voltage, current and the period of time during the current flow. Moreover, the thickness of an anodization film formed on the surface of the gate electrode is not varied in every production.

By providing the anodization controller between the voltage application terminal and the gate electrode in parallel or in series, a period of time during which a current flows can be varied in each portion. Therefore, anodization films having different thickness can be formed in a single anodization process.

When the anodization controller is formed on a partial area of a line by changing a width or a thickness thereof to be different from that of other areas, the anodization controller can be simultaneously formed when the line having the gate electrode as one end is patterned. Thus, the production process can be simplified.

Thus, the invention described herein makes possible the advantage of providing a circuit substrate not requiring a delicate control of the conditions of anodization when forming an oxidized film on the surfaces of gate electrode or wirings by an anodization method; in which a film thickness is uniform in every production, and several types of anodization films having different thickness can be formed in a simple process.

This and other advantages of the present invention will become apparent to those skilled in the art upon reading and understanding the following detailed description with reference to the accompanying figures.

BRIEF DESCRIPTION OF THE DRAWINGS

FIG. 7 is a plan view illustrating a primary part of a circuit substrate of Example 3.

DESCRIPTION OF THE PREFERRED EMBODIMENTS

Hereinafter, the present invention will be described by way of examples with reference to the accompanying drawings.

EXAMPLE 1

Figure 1:
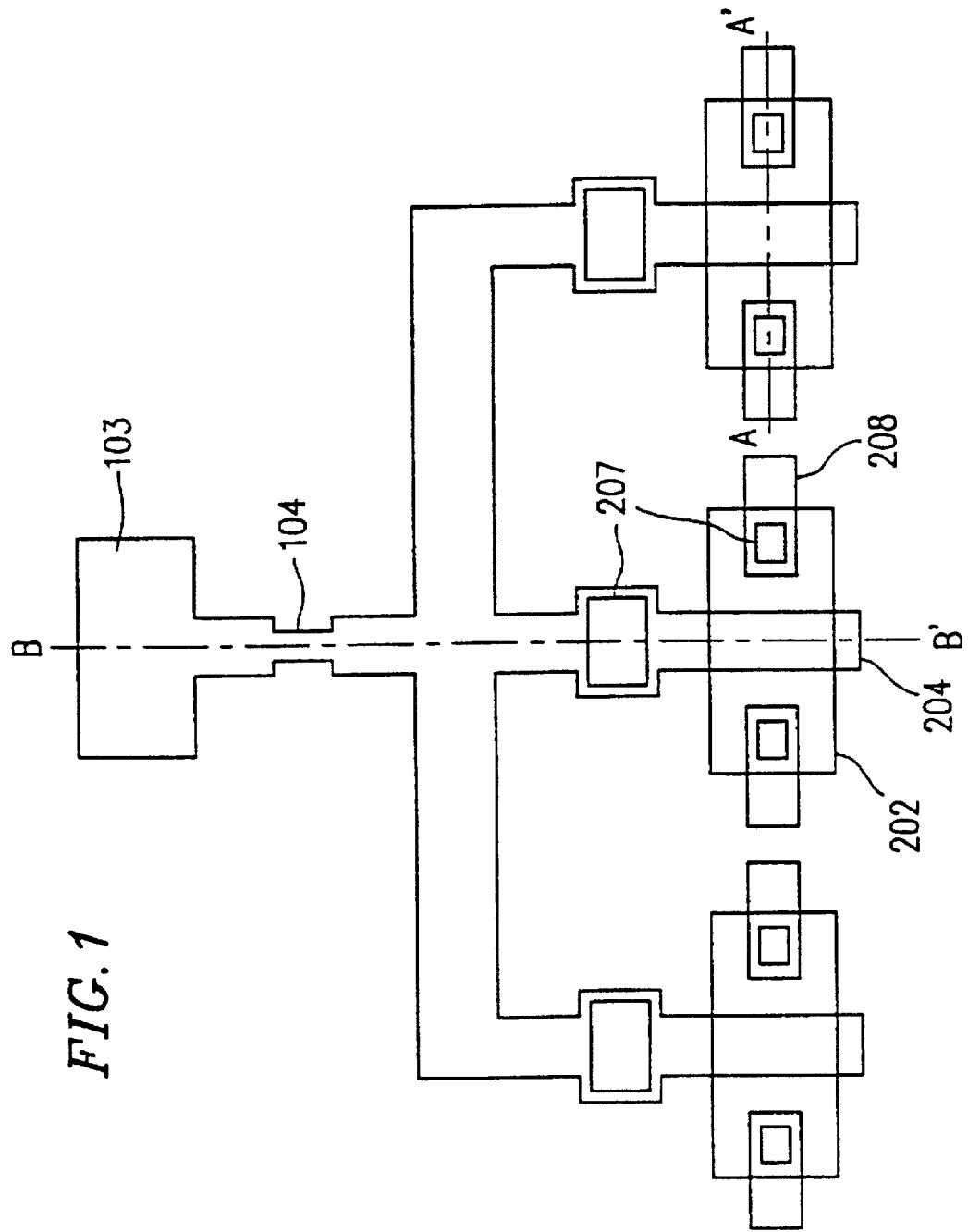
FIG. 1 is a plan view illustrating a primary part of a circuit substrate of the present invention.
Figure 2A:
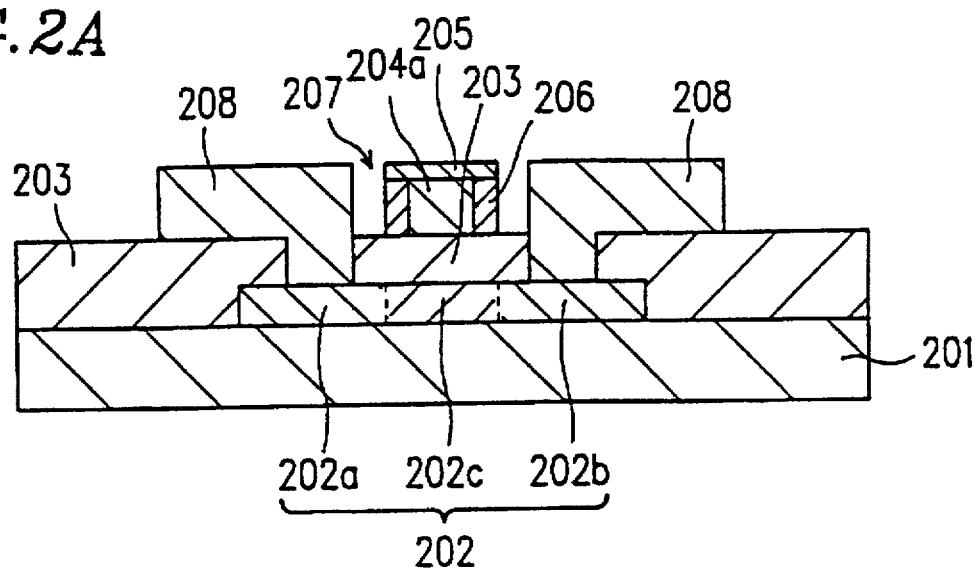
FIG. 2A is a cross sectional view of the circuit substrate taken at a line A—A' in FIG. 1.
Figure 2B:
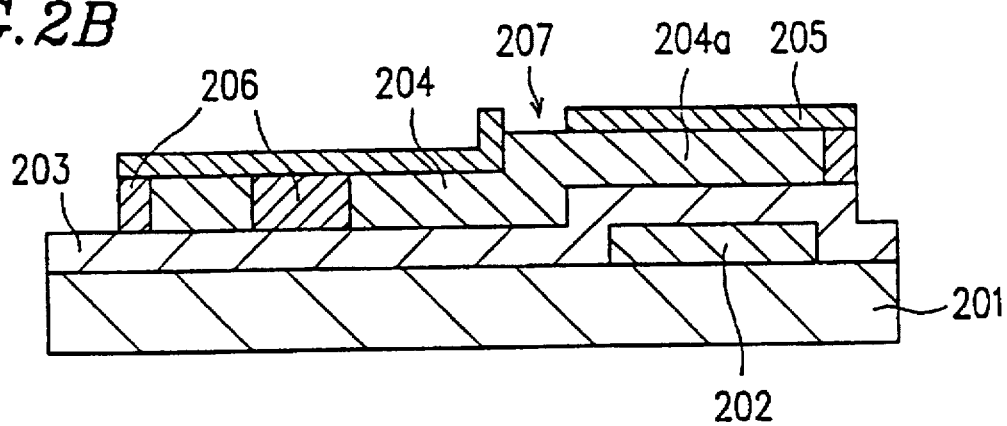
FIG. 2B is a cross sectional view of the circuit substrate taken at a line B—B' in FIG. 1.
Figure 3A:
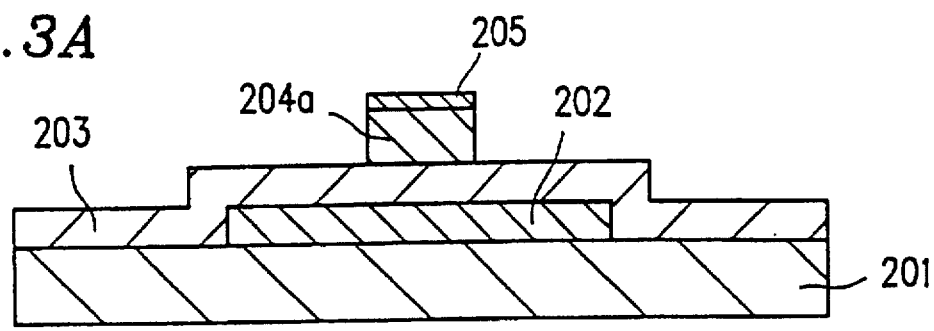
FIG. 3A is a cross sectional view of a transistor portion before forming offset regions in an anodization process in Example 1.
Figure 3B:
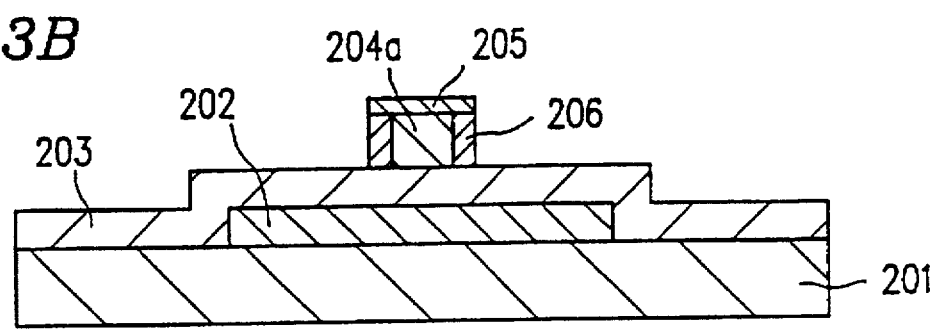
FIG. 3B is a cross sectional view of the transistor portion after forming the offset regions in the anodization process in Example 1.
Figure 3C:
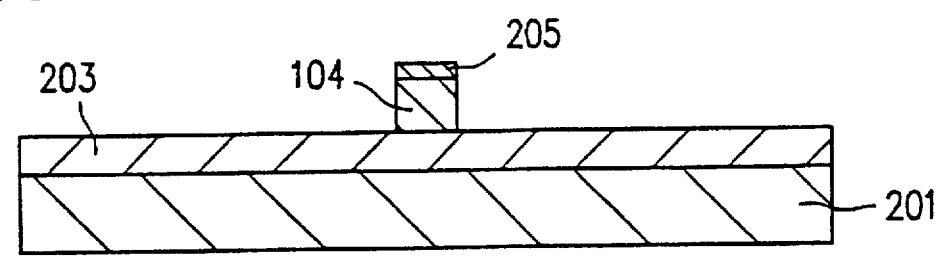
FIG. 3C is a cross sectional view of an anodization controller portion before forming the offset regions in the anodization process in Example 1.
Figure 3D:
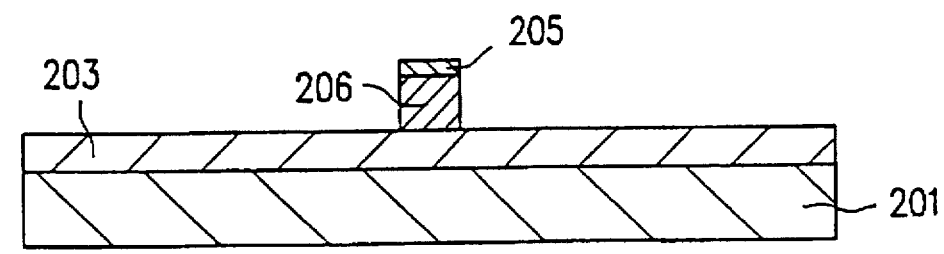
FIG. 3D is a cross sectional view of the anodization controller portion after forming the offset regions in the anodization process in Example 1.

FIG. 1 is a plan view showing a circuit substrate of the present example. FIGS. 2A and 2B are cross sectional views of the circuit substrate taken at lines A—A' and B—B' in FIG. 1, respectively. FIG. 3A through 3D sequentially show an anodization process of the present invention. FIG. 3A is a cross sectional view of a portion of the circuit substrate in which a transistor is to be formed (hereinafter, Simply referred to as a transistor portion), before forming offset regions of the transistor. FIG. 3B is a cross sectional view of the transistor portion after forming the offset regions. FIG. 3C is a cross sectional view of a portion of the circuit substrate in which an anodization controller is formed, before forming the offset regions. FIG. 3D is a cross sectional view of the anodization controller portion after forming the offset regions. In FIGS. 1, 2A, 2B and 3A through 3D, like components are labelled like reference numerals.

As shown in FIGS. 1, 2A and 2B, a circuit substrate of the present invention includes a plurality of thin film transistors (TFTs) formed on an insulating substrate 201. In FIG. 1, only three TFTs are illustrated. Each TFT includes a semiconductor layer 202 which is formed on the insulating substrate 201 and is patterned in an island shape, an insulating film 203 formed on the semiconductor layer 202 and a gate electrode 204a which is a part of a gate line 204. That is, the semiconductor layer 202 is insulated from the gate electrode 204a by the insulating film 203.

On the surface of the gate line 204 including the gate electrode 204a are formed a non-porous anodization film 205 and a porous anodization film 206. The non-porous anodization film 205 is formed on the top face of the gate line 204 including the gate electrode 204a. The porous anodization film 205 is formed on both side faces of the gate line 204 including the gate electrode 204a. The thickness of the anodization film 206 formed on the side face determines the width of the offset regions in the channel length direction as described below.

A pair of extension electrodes 208 are formed on the insulating film 203 so that each of the extension electrodes 208 fills a part of a contact hole 207. The extension electrodes 208 are electrically connected to a source region 202a and a drain region 202b of the semiconductor layer 202. The end of the source region 202a is spaced apart from the end of the gate electrode 204a by the thickness of the anodization film 206 to form an offset region. Similarly, the end of the drain region 202b is spaced apart from the end of the gate electrode 204a by the thickness of the anodization film 206 to form another offset region.

The other end portion of each gate line 204 which is not used as the gate electrode 204a is connected to another gate line 204 to form a common line. The common line is electrically connected to a voltage application terminal 103 for anodization via a narrow width portion 104 having a narrower width than other portions of the common line, as shown in FIG. 1. This narrow width portion 104 functions as anodization adjusting means for adjusting the thickness of the anodization film 206. The anodization film 206 is formed by externally applying a voltage to the voltage application terminal 103 to anodize the surface of the gate line 204.

The circuit substrate of the present invention is produced in the following manner.

First, a semiconductor layer 202 is formed on an insulating substrate 201 and is then patterned in an island shape. Glass, quartz or the like can be used for the insulating substrate 201. Examples of a material for the semiconductor layer 202 include Si and SiGe in an amorphous state, a microcrystalline state, a polycrystalline state and a single-crystalline state. A thickness thereof is in the range from 30 to 150 nm.

For example, in the case of forming an amorphous Si layer as the semiconductor layer 202, it can be formed by a plasma chemical vapor deposition (PCVD) method using $SiH_4$ gas and $H_2$ gas at a substrate temperature in a range of 200° to 300° C. When a microcrystalline Si layer is used as the semiconductor layer 202, it can be deposited by a PCVD method using $SiH_4$ gas and $H_2$ gas while a flow rate ratio of $SiH_4$ gas to $H_2$ gas is in a range of approximately 1/30 to 1/100 and the substrate temperature is at a temperature in a range of 200° to 400° C. In the case of using a polycrystalline Si layer, first, an amorphous silicon layer is deposited by a low-pressure CVD (LPCVD) method at a substrate temperature of 450° C. Then, the amorphous Si layer is annealed in $N_2$ gas at a temperature in a range of 550° to 600° C. for 24 hours to form the polycrystalline Si layer. Alternatively, the amorphous Si film deposited by the PCVD method under the above conditions can be used in place of the amorphous Si layer deposited by an LPCVD method. In all cases, $Si_2H_6$ may be used in place of $SiH_4$ as a gas material.

Alternatively, the polycrystalline Si layer can be formed in a polycrystalline state from the outset, in place of deposition of the amorphous Si layer and annealing the deposited layer, or can be formed by irradiating the deposited amorphous Si layer with a laser beam or a lamp light. SiGe or the like other than Si can be used as a material for the semiconductor layer. A thus produced semiconductor film is patterned by etching to form the semiconductor layer 202 having an island shape.

Next, the insulating film 203 is formed to cover the semiconductor layer 202. The insulating film 203 can be formed by an atmospheric pressure chemical vapor deposition (APCVD) method, a sputtering method, a low-pressure CVD method, a plasma CVD method, a remote plasma CVD method or the like. The thickness of the insulating film 203 is in the range of approximately 50 to 150 nm. In this example, an $SiO_2$ film is formed at 430° C. using $SiH_4$ gas and $O_2$ gas by the atmospheric pressure CVD method. Among the above-mentioned methods, in order to improve a coating property of the insulating film 203 during the steps, the film may be formed by the atmospheric pressure CVD method, the plasma CVD or the like using TEOS (Tetra-Ethyl-Ortho-Silicate, $Si(OC_2H_5)_4$) gas. Furthermore, $SiN_2$, Al$_2$O$_3$, Ta$_2$O$_5$, or the like can be used independently or in combination for forming the insulating film 203 other than SiO$_2$. Thereafter, in order to improve its insulating property, the insulating film 203 is annealed at 600° C. in a N$_2$ atmosphere for 12 hours.

Then, a metal film for forming the gate electrode line 204 including the gate electrode 204a is formed. An anodizable metal having Al, Ta, Nb, Ti or the like as the main component can be used for forming the metal film. A thickness of the metal film is in the fangs of approximately 200 to 400 nm. In particular, it is desirable to use a metal having aluminum such as Al, AlSi, AlTi, AlSc or the like as the main component, because electrode lines having a low resistance can be formed. In this example, a metal having aluminum as the main component is used to form a film on the entire surface of the substrate using a sputtering method.

Thereafter, the metal film formed on the entire surface of the substrate is anodized to form the anodization film 205 for protecting the surface of the metal film, as shown in FIGS. 3A and 3C. The anodization process is performed, for example, by immersing the substrate 201 in a solution in which a tartaric acid, a nitric acid or the like is diluted in an organic solvent such as ethylene glycol, and applying a voltage of 80V thereto. Thus, a non-porous anodization film 205 is formed on the surface of the metal film. The non-porous anodization film 205 works as a barrier for the top surface of the metal electrode, and enables another anodization film to be formed only on the side faces of the metal electrode, when another anodization process is performed in order to form offset regions. It is desirable that the non-porous film 205 be as thin as possible so as not to increase the resistance of the metal electrode.

Next, the metal film is patterned to form the gate lines 204 each including the gate electrode 204a. Simultaneously, a voltage application terminal 103 and an anodization controller 104 which is part of the common line connected to the terminal 103 and the gate lines 204 are also formed. The width of the anodization controller 104 is set depending on the desired offset width of the TFTs which are connected to the common line in the anodization process. More specifically, the width of the anodization controller 104 is determined so that the anodization controller 104 is completely anodized to serve as an insulating film through which current from the terminal 103 does not flow, when a thickness of an anodization film 206 formed on the side faces of the gate line 204 reaches a thickness required for obtaining the desired offset width. A width of the anodization controller 104 is, for example, in the range from 200 nm to 4 μm, though the width is varied depending on a desired offset width.

Then, an anodization process is performed to form the anodization film 206. The anodization process is performed, for example, by immersing the substrate in a solution of citric acid or oxalic acid, sulfuric acid or the like and applying a voltage of 8V. By performing the anodization process under these conditions, formation of a porous oxidized aluminum film proceeds from the side face of the gate line 204.

Figure 4A:
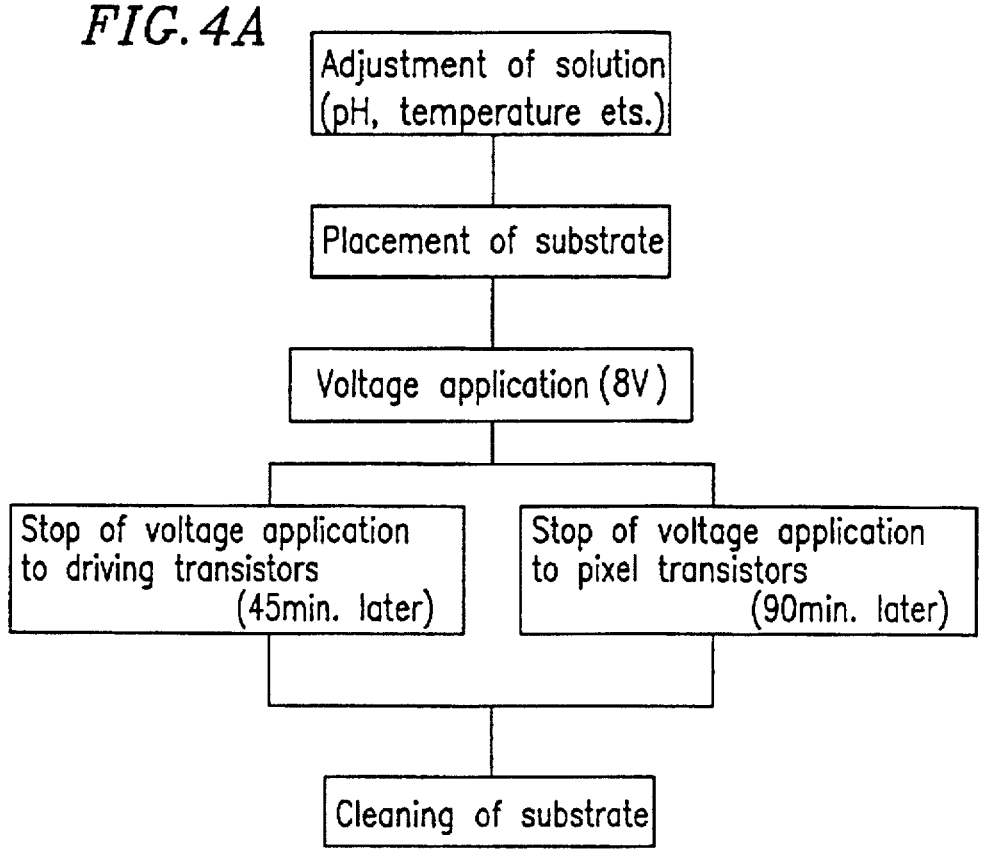
FIG. 4A is a flow chart of a conventional anodization process.
Figure 4B:
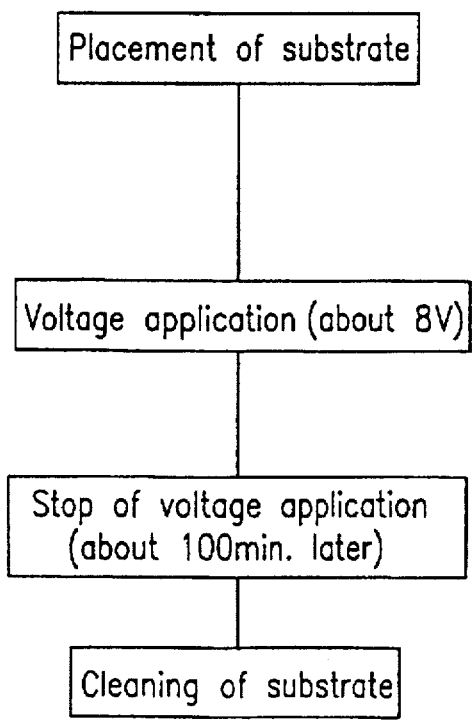
FIG. 4B is a flow chart of an anodization process according to the present invention.

With reference now to FIGS. 4A and 4B, an anodization process in the case of a conventional circuit substrate and a circuit substrate of the present example will be described.

As shown in FIG. 4A, in the case of the conventional circuit substrate, a solution in which the substrate is immersed needs to be adjusted to have appropriate pH, temperature and the like in accordance with the desired thickness of the anodization film to be formed, prior to immersing the substrate therein. Thereafter, the substrate is immersed in the solution, and a voltage, for example, of 8V is applied to metal wirings or the like formed on the substrate. Thus, metal wirings or the like formed on the substrate are anodized.

In an example shown in FIG. 4A, a pixel transistor for controlling a pixel to be in an ON state or in an OFF state end a driving transistor for driving the pixel transistor are to be formed on the substrate. This means that offset widths are different between the driving transistor end the pixel transistor. Therefore, a time period required for forming an anodization film having a desired thickness is different. For example, it takes 45 minutes to anodize the gate electrode to have a desired thickness in the driving transistor, whereas it takes 90 minutes to anodize the gate electrode in the pixel transistor. Finally, the substrate is cleaned, On the other hand, as shown in FIG. 4B, it is unnecessary to adjust a solution in which the substrate is immersed in the present example. In addition, since the thickness of the anodization film is controlled by the anodization controller, there is no need to precisely set a time period during which a voltage is applied to the metal wirings or the like. Therefore, an anodization process is less complicated in the present example compared to the conventional case.

The anodization of the gate line 204 is stopped when the anodization controller 104 is completely oxidized and therefore conductivity of the anodization controller 104 disappears, as described above. As a result, a voltage is not applied to portions farther than the anodization controller 104 from the terminal 103. Thus, the anodization film 206 having a thickness in accordance with a width of the anodization controller 104 is formed on the surface of the gate electrode 204a to stop the anodization process. Accordingly, a delicate control of anodization conditions is not required, nor is the anodization process affected by degradation of a solution or the like. Therefore, a complicated process such as the conventional anodization process shown in FIG. 4A is unnecessary, end the anodization process can be performed in a simple process shown in FIG. 4B. Since the non-porous anodization film 205 has been formed on the top face of the gate line 204 including the gate electrode 204a, the anodization film 205 is formed only on the side faces of the gate line 204 with a thickness from about 100 nm to 2 μm in accordance with a width of the anodization controller 104. The thickness of the anodization film 206 corresponds to the width of offset regions in the channel length direction of the transistor.

Thereafter, the common line is removed by etched so as to separate the transistors. Then, impurity ions (ions including phosphorus or boron in this example) are implanted using an ion doping apparatus. An example of conditions for injecting ions using the ion doping apparatus is as follows: PH$_3$ gas diluted with hydrogen gas by 5% is introduced from a gas introduction inlet; A high frequency power for plasma generation is 100 to 200W; A total acceleration voltage of ions is 10 to 100 kV; A total amount of ion implantation is $2 \times 10^{14}$ to $5 \times 10^{16}$ ions/cm$^2$. At this point, the ions are not implanted to a portion of the semiconductor layer 202 beneath the gate electrode 204a and the anodization film 206, so as to form a channel region 202c. An ion implantation apparatus may be used instead of the ion doping apparatus for implanting the impurity ions. Then, the impurity ions are activated, for example, by conducting annealing at 600° C. for 20 hours to form a source region 202a and a drain region 202b with the channel region 202c therebetween. The activation of the impurity ions may be conducted by irradiating the impurity ions with a strong light such as a laser beam.

Finally, contact holes 207 are formed on the insulating film 203. Then, a metal film is formed on the contact holes 207 by a sputtering method and patterned to form extension electrodes 208. The extension electrodes 208 are connected to the source region 202a and the drain region 202b. Thus, a thin film transistor is completed.

According to the present invention, the anodization controller is formed between the voltage application terminal for anodization and the gate line including the gate electrode. Owing to the anodization controller, a thickness of the anodization film formed on the side faces of the gate electrode, which determines the offset width in the channel length direction, can be controlled. Therefore, a delicate control of anodization conditions is unnecessary. Moreover, it is unlikely that the thickness of the anodization film formed on the surface of the gate electrode is different from one produced in another production process due to degradation of a solution. As a result, a transistor having offset regions can be produced in a satisfactory reproducibility. Furthermore, the anodization controller can be formed simultaneously with patterning for the gate line including the gate electrode, the formation of the anodization controller dose not complicate the production process of the transistor.

The anodization film formed on the gate line prevents hillocks from growing in the gate line, thus improving corrosion-resistance of the line and the transistor device and ensuring electrical insulation between layers in the line and the transistor device. Furthermore, when a low-resistance metal material, such as aluminum is used, a gate electrode and a gate line having a low resistance can be obtained. Thus, the gate electrode made of the metal material including aluminum is advantageously used in an active matrix liquid crystal display apparatus.

EXAMPLE 2

Figure 5:
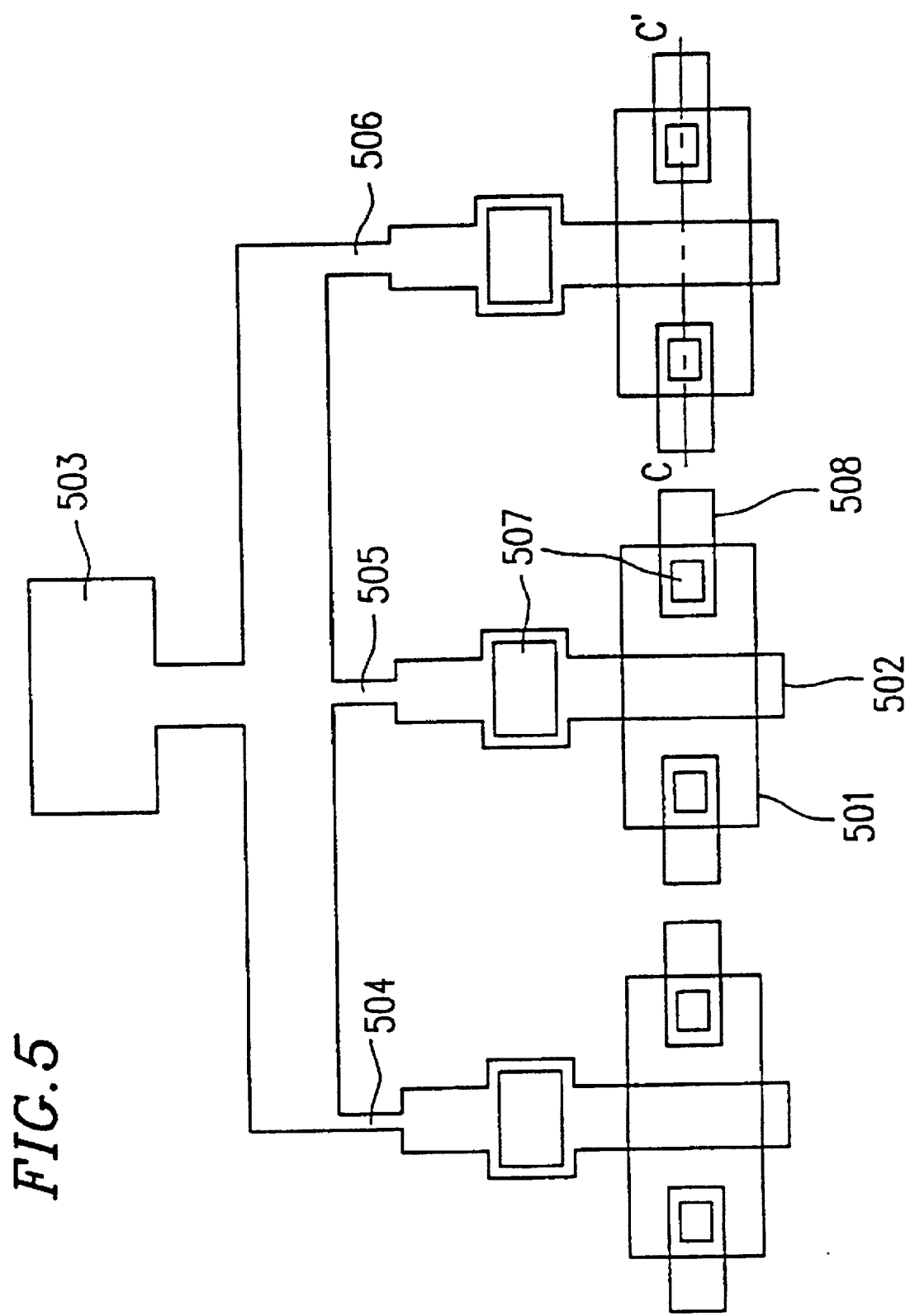
FIG. 5 is a plan view illustrating a primary part of a circuit substrate of Example 2.

FIG. 5 is a plan view showing a primary part of the circuit substrate of Example 2 of the present invention. A cross section taken at line C—C' of FIG. 5 has the same structure shown in FIG. 2A. The circuit substrate of the present example includes an insulating substrate on which island shaped semiconductor layers 501; gate lines 502; a voltage application terminal for anodization 503; anodization controllers 504, 505 and 506 provided in parallel with each other; contact holes 507; and extension electrodes 508 are formed. As shown in FIG. 5, the anodization controller is formed for each gate line 502 in the present example, whereas the anodization controller is commonly used for a plurality of gate lines in Example 1. In the circuit substrate of the present example, the anodization controllers 504, 505 and 506 have different widths so that degrees of an anodization process proceeds are different among the gate lines 502. Thus, it is possible for transistors using portions of the gate lines 502 as gate electrodes to have the different offset widths.

The circuit substrate is produced in the following manner.

First, the semiconductor layer 501 is formed on the insulating substrate and is then pattered in an island shape. An insulating film is formed to cover the semiconductor layer 501. The formation of the semiconductor layer 501 and the insulating film is conducted in the same manner as the semiconductor layer 202 and the insulating film 203 in Example 1.

Next, a metal film for forming the gate line 502 including the gate electrode is formed. The metal film can be formed using the Same materials in the same manner as in Example 1. In Example 2, the metal film is formed with a thickness from 200 to 400 nm on the entire surface using a metal having aluminum as the main component by a sputtering method.

Then, the metal film formed on the entire surface of the substrate is subjected to an anodization process to form an anodization film (corresponding to the anodization film 205 in FIG. 3A) for protecting the surface on the top face of the metal film. The anodization process can be performed in the same manner as that in forming the anodization film 205 in Example 1.

Thereafter, the metal film is patterned to form the gate lines 502. Simultaneously, a voltage application terminal 503 for anodization, anodization controllers 504, 505 and 506 and a common line portion connected to the anodization controllers 504, 505 and 506 to the voltage application terminal 503 are also formed. The anodization controllers 504, 505 and 506 are connected in parallel with each other by the common line portion.

The width of each anodization controller is set depending on the desired offset width of the TFTs. More specifically, the width of each anodization controller is determined so that the anodization controller is completely anodized to serve as an insulating film through which current from the terminal does not flow, when the thickness of an anodization film formed on the side faces of the gate line 502 (which corresponds to an anodization film 206 as shown in FIG. 3B) reaches the thickness required for obtaining the desired offset width. The anodization controllers 504, 505 and 506 are formed to have widths, for example, in the range of approximately 200 nm to 4 µm, depending on a desired offset width.

Then, an anodization process is performed to form the anodization film (corresponding to the anodization film 206 as shown in FIG. 3B) on the side faces of each gate line 502. The anodization process is performed, for example, by immersing the substrate in a solution of citric acid or oxalic acid, sulfuric acid or the like and applying a voltage of 8V. By performing the anodization process under these conditions, formation of a porous oxidized aluminum film proceeds from the side faces of each gate line 502.

When a corresponding one of the anodization controllers 504, 505 and 506 are completely oxidized, conductivity of the anodization controller disappears. As a result, a voltage is not applied to portions farther than the anodization controller from the terminal 503, whereby the anodization process stops. Thus, the anodization films having thicknesses in accordance with the widths of the anodization controllers 504, 505 and 506 are formed on The surface of the gate electrodes which are parts of the gate line 502 to stop the anodization process. Accordingly, a delicate control of anodization conditions is not required, nor is the anodization process affected by degradation of a solution or the like. Therefore, a complicated process such as the conventional anodization process is unnecessary, and the anodization process can be performed in a simple process.

Since the non-porous anodization films have been formed on the top faces of the gate lines 502 including the gate electrode, the porous anodization films are formed only on the side faces of the gate lines 502 with a thickness from about 100 nm to 2 µm in accordance with widths of the anodization controllers 504, 505 and 506. The thickness of the porous anodization films corresponds to offset widths.

Figure 6:
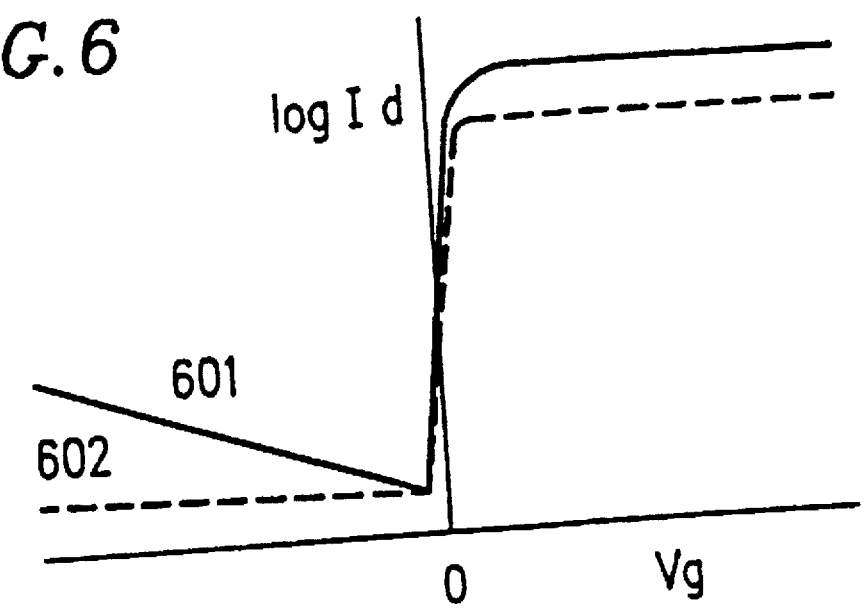
FIG. 6 is a graph showing the relationship between offset widths and transistor characteristics.

FIG. 6 shows transistor characteristics in the case where the offset width is changed. A solid line 601 indicates transistor characteristics in the case of a short offset width.

As is apparent from FIG. 6, the transistor having the short offset width has a large ON current, so that it is suitable for a driving transistor of a liquid crystal display apparatus which is used for driving a pixel transistor. On the other hand, a broken line 602 indicates transistor characteristics of a transistor having a long offset width. In the transistor having a long offset width, the ON current is small but the OFF current can be lowered. Therefore, the transistor having a long offset width is suitable for a pixel transistor of a liquid crystal display apparatus which is employed for controlling a pixel to be ON or OFF. In this way, an offset width required for the transistor is varied depending on a specific purpose for which the transistor is employed. According to the present example, various transistors having different offset widths can be easily obtained by varying the widths of the anodization controllers 504, 505 and 506.

After the formation of the anodization films of the side faces of the gate lines 502, the common line is etched to be removed in order to separate the transistors from each other. Then, impurity ions are implanted to form an source region and a drain region and are activated in the same manner as in Example 1.

Finally, contact holes 507 are formed on the insulating film. Then, a metal film is formed on the contact holes 507 by a sputtering method and patterned to form extension electrodes 508. The extension electrodes 508 are connected to the source end drain regions. Thus, a thin film transistor is completed.

In the present example, the anodization controller is formed for each gate electrode to control a thickness of the anodization film to be formed on the surface of the gate electrode. Therefore, delicate control of the anodization conditions is unnecessary. Moreover, it is unlikely that the thickness of the anodization film formed on the surface of the gate electrode is different from one produced in another production process due to degradation of a solution. As a result, a transistor having offset regions can be produced in a satisfactory reproducibility. Furthermore, the anodization controllers can be formed simultaneously with patterning for the gate lines and the voltage application terminal, the formation of the anodization controllers dose not complicate the production process of the transistor.

In addition, the anodization film formed on the gate line including the gate electrode prevents hillocks from growing in the gate electrode, thus improving corrosion-resistance and ensuring electrical insulation between layers in the line and the transistor device using the gate electrode. Furthermore, when a metal material including aluminum is used, a gate electrode and gate lines having low resistance can be formed. Thus, the gate electrode made of the metal material including aluminum is advantageously used in an active matrix liquid crystal display apparatus.

Furthermore, in Example 2, several types of transistors having different offset widths can be produced in a single anodization process by providing anodization controllers for the respective gate electrodes.

EXAMPLE 3

FIG. 7 is a plan view showing a primary part of a circuit substrate of Example 3 of the present invention. A cross section taken at line D—D' of FIG. 7 has the same structure shown in FIG. 2A. The circuit substrate of the present example includes island shaped semiconductor levers 701, a gate line 702 having a plurality of blanched portions, a voltage application terminal 703 for anodization, anodization controllers 704, 705 and 706 provided in the branched portions of the gate line 702, contact holes 707, and extension electrodes 708. In the vicinity of the end of each blanched portion, a thin film transistor including the semiconductor layer 701 is provided using the branched portion as a gate electrode. The extension electrodes 708 serve as a source electrode and a drain electrode which are respectively connected to a source region and a drain region of the semiconductor layer 701. In FIG. 7, an example in which the gate line 702 is branched into three portions and therefore three thin film transistors are formed is shown.

The anodization controllers 704, 705 and 706 is provided in the following manner. The anodization controller 704 is arranged between the voltage application terminal 703 and a position at which the gate line 702 is branched into two portions. One branched portion of the gets electrode 702 is used as a gate electrode of a transistor which is located on the left in FIG. 7, the other branched portion is further divided into two portions after the anodization controller 705 is provided. The anodization controller 705 has a narrower width than that of the anodization controller 704, so that a thin film transistor located in the center in FIG. 7 has a narrower offset width. After the other branched portion is further divided, the anodization controller 706 is provided for controlling a thickness of an anodization film of a thin film transistor located on the right in FIG. 7. The anodization controller 706 has the narrowest width among the three controllers 704, 705 and 706. Accordingly, in the present example, the anodization controllers 704, 705 and 706 are provided to have narrower widths as being located farther from the voltage application terminal 703, and are formed in series.

The circuit substrate is produced in the following manner.

First, the semiconductor layer 701 is formed on an insulating substrate end is then pattered in an island shape. An insulating film is formed so as to cover the semiconductor layer 701. The formation of the semiconductor layer 701 end the insulating film is conducted in the same manner as the semiconductor layer 202 and the insulating film 203 in Example 1.

Next, a metal film for forming the gate electrode line 702 including gate electrode is formed. The metal film can be formed using the same materials in the same manner as in Example 1. In Example 3, the metal film is formed in a thickness from 500 to 400 nm on the entire surface using a metal having aluminum as the main component by a sputtering method.

Then, the metal film formed on the entire surface of the substrate is subjected to an anodization process to form an anodization film (corresponding to the anodization film 205 in FIGS. 3A through 3D) for protecting the surface on the top face of the metal film. The anodization process can be performed in the same manner as that in forming the anodization film 205 in Example 1.

Thereafter, the metal film is patterned to form the gate line 702 having branched portions as described above. Simultaneously with the gate line 702, a voltage application terminal 703, anodization controllers 704, 705 and 706 are formed. The anodization controllers 704, 705 and 706 are connected in series.

The width of each anodization controller is set depending on the desired offset width of the TFTs. More specifically, the width of each anodization controller is determined so that the anodization controller is completely anodized to serve as an insulating film through which current from the terminal does not flow, when a thickness of an anodization film formed on the side faces of the gate line 702 (which corresponds to an anodization film 206 as shown in FIG. 3B) reaches a thickness required for obtaining the desired offset width. The anodization controllers 704, 705 and 706 are formed to have widths, for example, in the range of approximately 200 nm to 4 μm, depending on a desired offset width, so that the widths of the anodization controllers become narrower as being located farther from the voltage application terminal 703.

Then, an anodization process is performed to form the porous anodization film (corresponding to the anodization film 206). The anodization process is performed, for example, by immersing the substrate in a solution of citric acid or oxalic acid, sulfuric acid or the like and applying a voltage of 8V. By performing the anodization process under these conditions, the formation of the porous oxidized aluminum film proceeds from the side faces of the gets line 702. When the anodization controllers 704, 705 and 706 are completely oxidized, conductivity of the anodization controllers 704, 705 and 706 disappears. As a result, a voltage is not applied to portions farther than the anodization controllers 704, 705 and 706, whereby the anodization process stops. Thus, the porous anodization films having thicknesses in accordance with widths of the anodization controllers 704, 705 and 706 are formed on the surfaces of the gate electrodes to stop the anodization process. Accordingly, a delicate control of anodization conditions is not required, nor is the anodization process affected by degradation of a solution or the like. Therefore, a complicated process such as the conventional anodization process is unnecessary, and the anodization process can be performed in a simple process. Since the non-porous anodization film has been formed on the top face of the gate line 702 including the gate electrode, the porous anodization film is formed in a lateral thickness from about 100 nm to 2 μm in accordance with widths of the anodization controllers 704, 705 and 706 on the side faces of the gate line 702. The thickness of the porous anodization films corresponds to the offset widths of the transistors.

As described in Example 2, different transistor characteristics can be obtained depending on the width of an offset region. Accordingly, transistor characteristic serving a specific purpose can be obtained by varying the widths of the anodization controllers 704, 705 and 706 to be narrower as being located farther from the voltage application terminal 703.

Thereafter, each transistor is separated from the other transistor by etching a portion connecting the branched portions to be removed. Then, impurity ions are implanted into the semiconductor layer 701 to form a source region and a drain region sandwiching a channel region therebetween and are activated in the same manner as in Example 1. As described in Example 1, ions are not implanted into a portion of the semiconductor layer 701 beneath the gate electrode. This portion serves as the channel region of the thin film transistor.

Furthermore, contact holes 707 are formed on the insulating film. Then, a metal film is formed on the contact holes 707 by a sputtering method and patterned to form extension electrodes 708. The extension electrode 708 are connected to the source region and the drain region, respectively, through the contact holes 707. Thus, a thin film transistor is completed.

In the present example, the anodization controllers are formed between the voltage application terminal for anodization and the gate electrode to control a thickness of the anodization film to be formed on the surface of the gate electrode. Therefore, a delicate control of anodization conditions is unnecessary. Moreover, it is unlikely that the thickness of the anodization film formed on the surface of the gate electrode is different from one produced in another production process due to degradation of a solution. As a result, a transistor having offset regions can be produced with satisfactory reproducibility. Furthermore, the anodization controller can be formed simultaneously with patterning for the gate line, the formation of the anodization controllers dose not complicate the production process of the transistor.

The anodization film formed on the surface of the gate line including the gate electrode prevents hillocks from growing in the gate line, thus improving corrosion-resistance and ensuring electrical insulation between layers in the line and the thin film transistor including the gate electrode. Furthermore, when a metal material including aluminum is used, a gate electrode and a gate line having a low resistance can be formed. Thus, the gate electrode made of the metal material including aluminum is advantageously used in an active matrix liquid crystal display apparatus.

Furthermore, in Example 3, several types of transistors having different offset widths can be produced in a single anodization process by forming anodization controllers having narrower widths as being located farther from the voltage application terminal in series between the voltage application terminals for anodization and the respective gate electrodes.

EXAMPLE 4

Figure 8A:
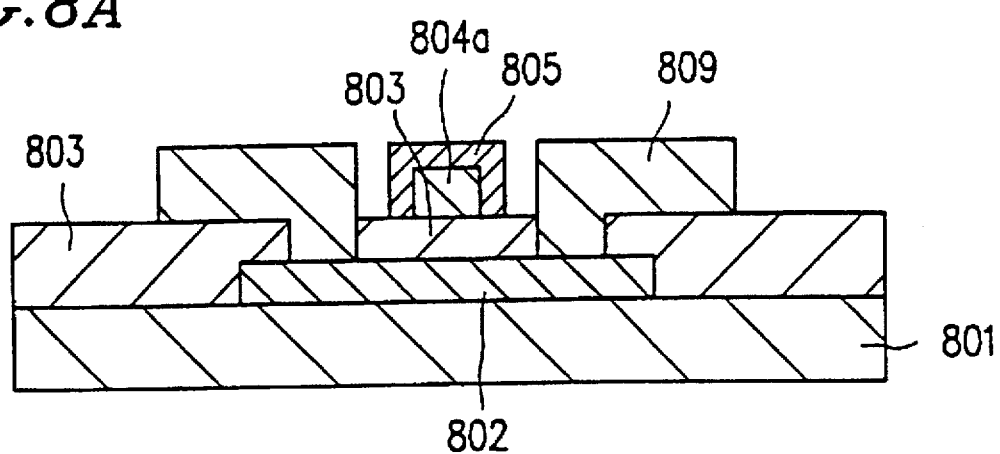
FIGS. 8A and 8B are cross sectional views illustrating a primary part of a circuit substrate of Example 4.
Figure 8B:
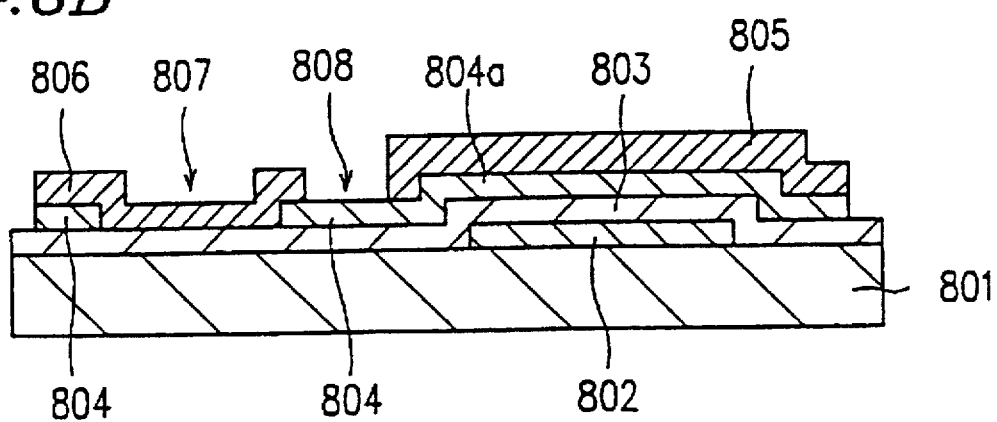

FIGS. 8A and 8B are cross sectional views showing a circuit substrate of Example 4, taken at the same positions as in FIGS. 2A and 2B, respectively. The circuit substrate of the present example includes an insulating substrate 801, an island shaped semiconductor layer 802, an insulating film 803, a gate line 804, a gate electrode 804a, an anodization film 805, a voltage application terminal 805 for anodization, an anodization controller 807 contact holes 808, and extension electrodes 809. The circuit substrate of the present example is the same as that in Example 1 in that the anodization controller 807 is formed between the voltage application terminal 805 and the gate electrodes 804a, but is different from Example 1 in that the anodization controller 807 has a thickness in accordance with a desired offset width, whereas the anodization controller 807. By appropriately setting the thickness of the anodization controller 807, a transistor having offset regions which have a desired width in the channel length direction can be obtained.

The circuit substrate is produced in the following manner.

First, the semiconductor layer 802 is formed on an insulating substrate 801 end is then patterned in an island shape. The insulating film 803 is formed to cover the semiconductor layer 802. The formation of the semiconductor layer 802 end the insulating film 803 is conducted in the same manner as the semiconductor layer 202 and the insulating film 203 in Example 1.

Next, two metal films for forming the gate line 804 including gate electrode 804a are formed. First, a first metal film is formed, and a portion of the first metal film where the anodization controller 807 is to be located is peeled by patterning. For the first metal film, anodizable metal having Al, Ta, Nb, Ti or the like as the main component can be used. A thickness of the first metal film is in the range of 200 to 400 nm. In particular, a ,metal having aluminum as the main ingredient such as Al, AlSi, AlTi, AlSc or the like Is preferably used because electrodes having a low resistance can be formed. In .the present example, the metal film is formed with a thickness from about 200 to 400 nm using a metal having aluminum as the main component by a sputtering method, and then a portion of the metal film at which the anodization controller 807 is to be formed is peeled.

Subsequently, a second film is formed on the substrate. Similarly, for the second metal film, a metal having aluminum as the main component such as Al, AlSi, AlTi, AlSc or the like can be used. In addition, an anodizable metal having Ta, Nb, Ti as the main component can be also used. A thickness of the second metal film is in the range of 200 to 400 nm. In the present example, the metal films are formed with a thickness from 200 to 400 nm using metals having aluminum as the main component by a sputtering method. Thus, there exists a thin portion at which only the second metal film is formed. This portion is used as the anodization controller 807.

Thereafter, the metal film is patterned to form the gate line 804 including the gate electrode 804a. Simultaneously with the gate line 804, a voltage application terminal 806 for anodization is formed so that it is formed of the first and second metal films as well as the gate line 804.

Then, an anodization process is performed to form the anodization film 805. The anodization process is performed, for example, by immersing the substrate in a solution of citric acid, oxalic acid, sulfuric acid or the like and applying a voltage of 8V. By performing the anodization process under these conditions, the formation of a porous oxidized aluminum film proceeds from the top and side faces of the gate electrode line 804.

When the portion of the second metal consisting of one layer on the anodization controller 807 is completely oxidized, conductivity of the anodization controller 807 disappears. As a result, a voltage is not applied to portions farther than the anodization controller 807, whereby the anodization process stops. Thus, the anodization film 805 having a thickness corresponding to a thickness of the anodization controller 807, i.e., a thickness of the second metal film is formed on the surface of the gate electrode 804a to stop the anodization process. Accordingly, a delicate control of anodization conditions is not required, nor is the anodization process affected by degradation of a solution or the like. Therefore, a complicated process such as the conventional anodization process is unnecessary, and the anodization process can be performed in a simple process. The anodization film 805 is formed in a thickness from about 200 nm to 400 nm in accordance with a thickness of the anodization controller 807 on the top and side faces of the metal like. The thickness of the anodization film 805 determines the offset width of the transistor.

Thereafter, a portion connecting the transistors is removed by etching to separate the transistors. Then, impurity ions are implanted into the semiconductor layer 802 to form a source region and a drain region and are activated in the same manner as in Example 1.

Furthermore, contact holes 808 are formed on the insulating film 803. Then, a metal film is formed on the contact holes 808 by a sputtering method and patterned to form the extension electrodes 809. Thus, a thin film transistor is completed.

In the present example, the anodization controller is formed between the voltage application terminal and the gate electrode to have a thickness in accordance with a thickness of the anodization film determined depending on a desired offset width. Therefore, a delicate control of anodization conditions is unnecessary. Moreover, it is unlikely that the thickness of the anodization film formed on the surface of the gate electrode is different from one produced in another production process due to degradation of a solution. As a result, a transistor having offset regions can be produced in a satisfactory reproducibility. Furthermore, the anodization controller can be formed simultaneously with forming a metal film for the gate electrode line, the formation of the anodization controller dose not complicate the production process of the transistor.

The anodization film formed on the surface of the gate line including the gate electrode prevents hillocks from growing in the gate line, thus improving corrosion-resistance and ensuring electrical insulation between layers in the line, end the transistor including the gate electrode. Furthermore, when a metal material including aluminum is used, a gate electrode and a gate line having a low resistance can be formed. Thus, the gate electrode made of the metal material including aluminum is advantageously used in an active matrix liquid crystal display apparatus.

Furthermore, in Example 4, the portion of the first metal film on the anodization controller 807 is peeled, and then the second metal film is formed thereon. Thus, the portion of the anodization controller 807 is formed of a thin metal film, but the present invention is not limited to this example as long as the thickness of the anodization controller 807 is set so that the anodization controller 807 is completely oxidized when the thickness of the anodization film 805 reaches a desired thickness. For example, a single layered metal film may be formed, and then etching may be conducted to make only the portion of the anodization controller 807 thin.

In addition, each of the anodization controllers in Examples 2 and 3 can have a thickness in accordance with a desired thickness of an anodization film formed on the gate electrode, instead of having a width depending on the desired thickness. In this case, the same effect described in Example 4 can be obtained.

As is apparent from the description above, according to the present invention, an anodization process can be stopped after the anodization process proceeds to a predetermined extent, because an anodization controller is provided between the voltage application terminal end the gate electrode. Therefore, a delicate control of a voltage, current and a period of time is not required. Moreover, it is unlikely that the thickness of the anodization film formed on the surface of the gate electrode is different from one produced in another production process due to degradation of a solution. As a result, an anodization film having a desired thickness can be produced with satisfactory reproducibility.

Furthermore, since the anodization controller can be formed simultaneously with forming the gate line and the gate electrode by changing a width or thickness of a portion to be used as the anodization controller in accordance with the desired thickness of the anodization film, the formation of the anodization controller can be easily formed without complicating the production process of the transistor.

The circuit substrate of the present invention having such advantages is widely used in an active matrix liquid crystal display apparatus and other electronic circuits. In particular, when a metal material including aluminum is used, a gate electrode and a gate bus line having a low resistance can be formed. In addition, hillocks occurring in an aluminum electrode or an aluminum line is suppressed because of the existence of the anodization film covering the surface of the electrode or line, thus improving corrosion-resistance and ensuring electrical insulation. Thus, the gate electrode made of the metal material including aluminum is advantageously used in an active matrix liquid crystal display apparatus.

Moreover, when the anodization controllers are provided in parallel or series, periods of time during which current flows can be different in every line pattern. Therefore, several types of oxidized films having different thickness can be formed in a single anodization process. When the circuit substrate is applied to an active matrix liquid crystal display apparatus including a circuit substrate having display and driving functions, transistors having specific characteristics in accordance with respective purposes can be formed in a simplified production process, because several types of offset widths can be formed in a single anodization process.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit substrate comprising:

a wiring mainly formed of a metal material, the wiring having an end portion used as a electrode;

a terminal for applying a voltage to the wiring to anodize the wiring, the terminal being connected to another end portion of the wiring; and an anodization control portion for controlling a degree of anodization of the wiring, the anodization control portion being a portion of the wiring which is closer to the another end portion connected to the terminal than to the end portion serving as the electrode, wherein the anodization control portion is anodized by the voltage applied by the terminal to form an insulator, and wherein at least one of either a width or a thickness of the anodization control portion is determined so that an anodization film having a predetermined thickness is formed on the surface of the end portion of the wiring when the anodization of the anodization control portion is completed.

2. A circuit substrate according to claim 1, wherein the circuit substrate has a substrate, and wherein the terminal, the wiring, and the anodization portion are all formed on the substrate of the circuit substrate.

3. A circuit substrate comprising:

a plurality of semiconductor devices including electrodes;

a wiring having a plurality of branched portions and mainly formed of a metal material, the branched portions serving as the electrodes of the semiconductor devices;

a terminal for applying a voltage to the wiring to anodize the branched portions, the terminal being connected to the wiring; and at least one anodization controlling portion for controlling degrees of anodization of the branched portions, wherein at least one of either a width or a thickness of the at least one anodization controlling portion is determined so that an anodization film having a predetermined thickness is formed on each of the branched portions.

4. A circuit substrate according to claim 3, wherein the anodization controlling portion is a portion of the wiring other than the branched portions.

5. A circuit substrate according to claim 4, wherein the portion has a narrower width than that of the branched portions.

6. A circuit substrate according to claim 4, wherein the portion is thinner than the branched portions.

7. A circuit substrate according to claim 3, wherein a plurality of anodization controlling portions are formed as portions of the branched portions and are connected in parallel with each other, each of the anodization controlling portions having a narrower width than that of a corresponding one of the branched portions.

8. A circuit substrate according to claim 7, wherein the anodization controlling portions have different widths.

9. A circuit substrate according to claim 3, wherein a plurality of anodization controlling portions are provided as portions of the branched portions and are connected in series, each of the anodization controlling portions having a narrower width than that of a corresponding one of the branched portions.

10. A circuit substrate according to claim 9, wherein the anodization controlling portions have different widths.

11. A circuit substrate according to claim 3, wherein a plurality of anodization controlling portions are provided as portions of the branched portions and are connected in parallel with each other, each of the anodization controlling portions having a thickness smaller than that of a corresponding one of the branched portions.

12. A circuit substrate according to claim 11, wherein the anodization controlling portions have different thicknesses.

13. A circuit substrate according to claim 3, wherein a plurality of anodization controlling portions are provided as portions of the branched portions and are connected in a series, each of the anodization controlling portions having a thickness smaller than that of a corresponding one of the branched portions.

14. A circuit substrate according to claim 13, wherein the anodization controlling portions have different thicknesses.

15. A circuit substrate according to claim 3, wherein a plurality of anodization controlling portions are provided, and at least one is a portion of the wiring other than the branched portions.

16. A circuit substrate according to claim 3, wherein the circuit substrate has a substrate, and wherein the terminal, the wiring, and the anodization portion are all formed on the substrate of the circuit substrate.

* * * * *